US008587104B2

(12) United States Patent
Miyasaka et al.

(10) Patent No.: US 8,587,104 B2
(45) Date of Patent: Nov. 19, 2013

(54) WIRING BOARD AND SEMICONDUCTOR PACKAGE

(75) Inventors: Fumihisa Miyasaka, Nagano (JP); Junji Sato, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 86 days.

(21) Appl. No.: 13/330,944

(22) Filed: Dec. 20, 2011

(65) Prior Publication Data

US 2012/0161311 A1     Jun. 28, 2012

(30) Foreign Application Priority Data

Dec. 22, 2010   (JP) ................................. 2010-286677

(51) Int. Cl.
*H01L 23/02*     (2006.01)
(52) U.S. Cl.
USPC .................. 257/678; 257/777; 257/E21.091; 257/E21.134; 257/E21.499; 257/E21.509; 257/E21.511; 257/E21.517
(58) Field of Classification Search
USPC ......... 257/678, 777, 734, 778, 780, 760, 762, 257/659, E21.091, E21.134, E21.499, 257/E21.509, E21.511, E21.517
See application file for complete search history.

(56) References Cited

U.S. PATENT DOCUMENTS

| 4,790,902 A | * | 12/1988 | Wada et al. | 216/20 |
| 5,106,454 A | * | 4/1992 | Allardyce et al. | 216/20 |
| 5,501,350 A | * | 3/1996 | Yoshida et al. | 216/20 |

FOREIGN PATENT DOCUMENTS

JP          3821993         6/2006

* cited by examiner

*Primary Examiner* — David Nhu
(74) *Attorney, Agent, or Firm* — Drinker Biddle & Reath LLP

(57) ABSTRACT

A wiring board includes a stacked body having a plurality of insulating layers and a plurality of wiring layers which are alternately stacked, and a solder-resist layer being formed on one side of the stacked body and covering the wiring layer exposed to the one side of the stacked body. The insulating layer is exposed to the other side of the stacked body. The solder-resist layer is in a transparent or semitransparent light yellow color.

15 Claims, 16 Drawing Sheets

WIRING BOARD AND SEMICONDUCTOR PACKAGE

CROSS-REFERENCE TO RELATED APPLICATION(S)

The present application claims the benefit of priority of Japanese Patent Application No. 2010-286677, filed on Dec. 22, 2010. The disclosure of this application is incorporated herein by reference.

BACKGROUND

1. Technical Field

The present disclosure relates to a wiring board in which wiring layers and insulating layers are stacked, and a semiconductor package in which a semiconductor chip is mounted on the wiring board.

2. Related Art

Heretofore, there has been known a so-called "build-up wiring board" wherein a plurality of wiring layers and a plurality of insulating layers are alternately stacked, and wherein the wiring layers which are adjacent through the insulating layer are connected to each other by a via hole which penetrates though the insulating layer held between the adjacent wiring layers. The build-up wiring board includes a type which has a core board serving as a support, but a coreless build-up wiring board which does not have the core board serving as the support is noticed especially from the viewpoint of thinning a structure.

In general, the insulating layer of light yellow color is exposed to one side (hereinbelow, referred as "first principal surface side") of the coreless build-up wiring board, while a solder-resist layer of green color is exposed to the other side (hereinbelow, referred as "second principal surface side"). That is, external color tones differ between on the first principal surface side and the second principal surface side of the build-up wiring board.

PATENT DOCUMENT

[Patent Document 1] Japanese Patent No. 3,821,993

Meanwhile, in the coreless build-up wiring board, an external appearance inspection or the like employing an image recognition apparatus is conducted. On that occasion, when the external color tones are different between on the first principal surface side and the second principal surface side, it has been necessary to prepare the image recognition apparatus for use in the inspection of the second principal surface side, separately from the image recognition apparatus for use in the inspection of the first principal surface side, or to alter settings in case of employing the image recognition apparatus which is common to the inspections of the first principal surface side and the second principal surface side.

SUMMARY

Exemplary embodiments of the invention provide a wiring board and a semiconductor package in which a semiconductor chip is mounted on the wiring board, by which a common apparatus can be employed for the inspections of both the surface sides of the wiring board and the settings of the apparatus can be made substantially identical in the inspections of both the surface sides of the wiring board.

A wiring board according to an exemplary embodiment includes a stacked body having a plurality of insulating layers and a plurality of wiring layers which are alternately stacked, and a solder-resist layer being formed on one side of the stacked body and covering the wiring layer exposed to the one side of the stacked body. The insulating layer is exposed to the other side of the stacked body. The solder-resist layer is in a transparent or semitransparent light yellow color.

According to the wiring board or the semiconductor package in which a semiconductor chip is mounted on the wiring board of the exemplary embodiments of the invention, a common apparatus can be employed for the inspections of both the surface sides of the wiring board and the settings of the apparatus can be made substantially identical in the inspections of both the surface sides of the wiring board.

DETAILED DESCRIPTION

Now, a mode for carrying out the invention will be described with reference to the drawings. Identical numerals and signs are respectively assigned to the same constituent portions throughout the individual drawings, and they shall be omitted from repeated description.

First Embodiment

[Structure of Wiring Board According to First Embodiment]

Figure 1:
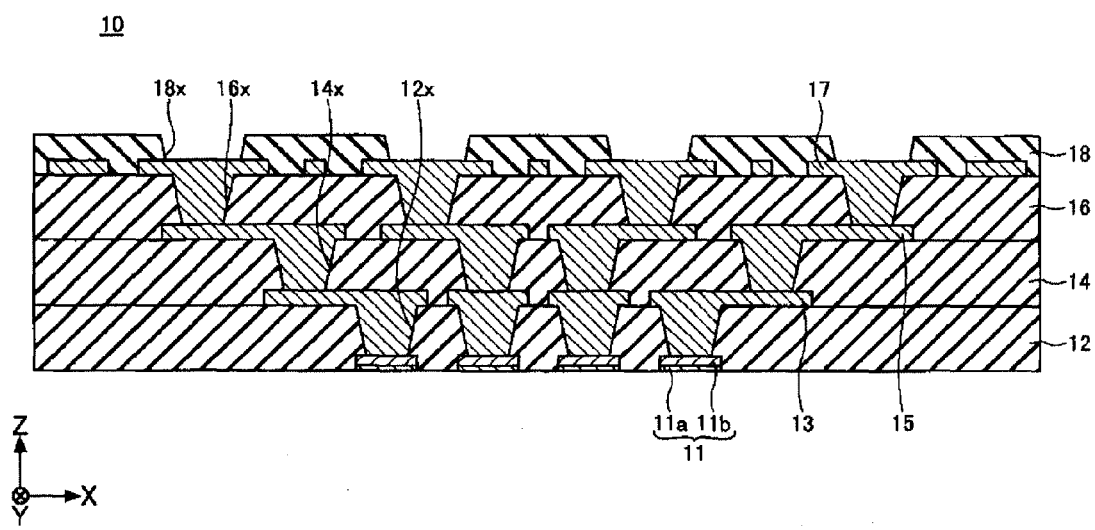
FIG. 1 is a sectional view exemplifying a wiring board according to a first embodiment.

First of all, the structure of a wiring board according to the first embodiment will be described. FIG. 1 is a sectional view exemplifying the wiring board according to the first embodiment. Referring to FIG. 1, the wiring board 10 according to the first embodiment is a coreless build-up wiring board including a stacked body in which a first wiring layer 11, a first insulating layer 12, a second wiring layer 13, a second insulating layer 14, a third wiring layer 15, a third insulating layer 16 and a fourth wiring layer 17 are successively stacked, and a solder-resist layer 18 which is formed so as to cover the fourth wiring layer 17 exposed to one side of the stacked body.

In this embodiment, for the sake of convenience, the side of the first insulating layer 12 is defined as a lower side, and the side of the solder-resist layer 18 as an upper side. For example, that surface of the first insulating layer 12 which contacts with the second insulating layer 14 is the upper surface thereof, while the exposed surface of the first insulating layer 12 (surface opposite to the surface contacting with the second insulating layer 14) is the lower surface thereof. In the wiring board 10, the lower surface side of the first insulating layer 12 shall be referred as "first principal surface", and the upper surface side of the solder-resist layer 18 shall be referred as "second principal surface".

In the wiring board 10, the first wiring layer 11 includes a first layer 11a and a second layer 11b. As the first layer 11a, there can be used, for example, a conductive layer in which a gold (Au) film, a palladium (Pd) film and a nickel (Ni) film are successively stacked in the order mentioned, with the gold (Au) film exposed outside the wiring board 10. As the first layer 11a, there may be used, for example, a conductive layer in which a gold (Au) film and a nickel (Ni) film are successively stacked in the order mentioned, with the gold (Au) film exposed outside the wiring board 10. As the second layer 11b, there can be used, for example, a conductive layer which includes a copper (Cu) layer or the like. The thickness of the first wiring layer 11 can be set at, for example, 10-20 μm or so.

Part of the first wiring layer 11 (the lower surface of the first layer 11a) is exposed from the first insulating layer 12, and it is made substantially flush with the lower surface of the first insulating layer 12. The part of the first wiring layer 11 (the lower surface of the first layer 11a) functions as an electrode pad which is electrically connected with a semiconductor chip or the like (not shown). Hereinbelow, the first wiring layer 11 exposed from the first insulating layer 12 shall be referred as "first electrode pad 11". In this embodiment, the side of the first electrode pad 11 is a side on which the semiconductor chip is mounted. The plan shape of the first electrode pad 11 is, for example, a circle, the diameter of which can be set at, for example, 40-120 μm or so. The pitch of the first electrode pads 11 can be set at, for example, 100-200 μm or so.

The first insulating layer 12 is formed so as to cover the upper surfaces of the first wiring layers 11 (those surfaces which are connected with vias of the second wiring layers 13) and the side surfaces thereof, and to expose the lower surfaces of the first wiring layers 11 (surfaces opposite to those surfaces which are connected with the vias of the second wiring layers 13). As the material of the first insulating layer 12, there can be used, for example, an insulating resin whose main ingredient is an epoxy type resin. A thermosetting resin, for example, can be used as the insulating resin which is the material of the first insulating layer 12. The thickness of the first insulating layer 12 can be set at, for example, 15-35 μm or so. The first insulating layer 12 may contain a filler of silica ($SiO_2$) or the like.

The color of the first insulating layer 12 can be set at, for example, a light yellow color. However, even when the color of the first insulating layer 12 itself is the light yellow color, the gold (Au) film constituting the first wiring layer 11 is exposed from the first insulating layer 12. Copper (Cu) or the like which is the material of the second wiring layer 13 may be seen through the first insulating layer 12. Therefore, the external color tone of the whole side of the first principal surface becomes a light brown to brown color.

The second wiring layer 13 is formed on the first insulating layer 12. The second wiring layer 13 includes the via which is filled in a first via hole 12x penetrating through the first insulating layer 12 and exposing the upper surface of the first wiring layer 11, and a wiring pattern which is formed on the first insulating layer 12. The first via hole 12x is a circular truncated cone-shaped recess which is open to the side of the second insulating layer 14, whose bottom surface is formed by the upper surface of the first wiring layer 11. The area of an open part of the first via hole 12x is larger than that of the bottom surface. The via is formed in the recess. That is, the via is a wiring line which penetrates through the insulating layer, and such vias connect the individual wiring layers to one another. The diameter of the via (wiring line penetrating through the insulating layer) on the side of the second principal surface is larger than the diameter thereof on the side of the first principal surface.

The second wiring layer 13 is electrically connected with the first wiring layer 11 which is exposed to the bottom part of the first via hole 12x. Copper (Cu), for example, can be used as the material of the second wiring layer 13. The thickness of the wiring pattern constituting the second wiring layer 13 can be set at, for example, 10-20 μm or so.

The second insulating layer 14 is formed on the first insulating layer 12 so as to cover the second wiring layer 13. As the material of the second insulating layer 14, there can be used an insulating resin which is similar to the material of the first insulating layer 12. The thickness of the second insulating layer 14 can be set at, for example, 15-35 μm or so. The second insulating layer 14 may contain a filler of silica ($SiO_2$) or the like. The color of the second insulating layer 14 can be set at, for example, a light yellow color.

The third wiring layer 15 is formed on the second insulating layer 14. The third wiring layer 15 includes a via which is filled in a second via hole 14x penetrating through the second insulating layer 14 and exposing the upper surface of the second wiring layer 13, and a wiring pattern which is formed on the second insulating layer 14. The second via hole 14x is a circular truncated cone-shaped recess which is open to the side of the third insulating layer 16, whose bottom surface is formed by the upper surface of the second wiring layer 13. The area of an open part of the second via hole 14x is larger than that of the bottom surface. The via is formed in the recess.

The third wiring layer 15 is electrically connected with the second wiring layer 13 which is exposed to the bottom part of the second via hole 14x. Copper (Cu), for example, can be used as the material of the third wiring layer 15. The thickness of the wiring pattern constituting the third wiring layer 15 can be set at, for example, 10-20 μm or so.

The third insulating layer 16 is formed on the second insulating layer 14 so as to cover the third wiring layer 15. As the material of the third insulating layer 16, there can be used an insulating resin which is similar to the material of the first insulating layer 12 and the second insulating layer 14. The thickness of the third insulating layer 16 can be set at, for example, 15-35 μm or so. The third insulating layer 16 may contain a filler of silica ($SiO_2$) or the like. The color of the third insulating layer 16 can be set at, for example, a light yellow color.

The fourth wiring layer 17 is formed on the third insulating layer 16. The fourth wiring layer 17 includes a via which is filled in a third via hole 16x penetrating through the third insulating layer 16 and exposing the upper surface of the third wiring layer 15, and a wiring pattern which is formed on the third insulating layer 16. The third via hole 16x is a circular truncated cone-shaped recess which is open to the side of the solder-resist layer 18, whose bottom surface is formed by the upper surface of the third wiring layer 15. The area of an open part of the third via hole 16x is larger than that of the bottom surface. The via is formed in the recess.

The fourth wiring layer 17 is electrically connected with the third wiring layer 15 which is exposed to the bottom part of the third via hole 16x. Copper (Cu), for example, can be used as the material of the fourth wiring layer 17. The thickness of the wiring pattern constituting the fourth wiring layer 17 can be set at, for example, 10-20 µm or so.

The solder-resist layer 18 is formed on the third insulating layer 16 so as to cover the fourth wiring layer 17. The solder-resist layer 18 has an opening 18x, and part of the fourth wiring layer 17 is exposed to the bottom part of the opening 18x. The fourth wiring layer 17 exposed to the bottom part of the opening 18x functions as an electrode pad which is electrically connected with a mother board or the like mounting board (not shown). If necessary, a metal layer may be formed on the fourth wiring layer 17 which is exposed to the bottom part of the opening 18x. As an example of the metal layer, there can be mentioned an Au layer, an Ni/Au layer (a metal layer in which an Ni layer and an Au layer are stacked in this order), or an Ni/Pd/Au layer (a metal layer in which an Ni layer, a Pd layer and an Au layer are stacked in this order).

Further, (in a case where the metal layer is formed on the fourth wiring layer 17 exposed to the bottom part of the opening 18x), an external connection terminal such as a solder ball or a lead pin may be formed (on the metal layer) on the fourth wiring layer 17 exposed to the bottom part of the opening 18x. The external connection terminal serves as a terminal for the electrical connection with the mother board or the like mounting board (not shown). However, the fourth wiring layer 17 exposed to the bottom part of the opening 18x (the metal layer in the case where the metal layer is formed on the fourth wiring layer 17), itself may be used as the external connection terminal.

Hereinbelow, the fourth wiring layer 17 exposed to the bottom part of the opening 18x shall be referred as "second electrode pad 17". In this embodiment, the side of the second electrode pad 17 is the side of the external connection terminal. The plan shape of the second electrode pad 17 is, for example, a circle, the diameter of which can be set at, for example, 200-1000 µm or so. The pitch of the second electrode pads 17 is wider than the pitch (for example, 100-200 µm or so) of the first electrode pads 11, and it can be set at, for example, 500-1200 µm or so.

In the wiring board 10, the wiring pattern constituting the fourth wiring layer 17 may be formed so as to be led out on the third insulating layer 16, and the wiring pattern led out on the third insulating layer 16 may be exposed from the opening 18x of the solder-resist layer 18 and be used as the second electrode pad 17. That is, the part of the fourth wiring layer 17 except on the third via hole 16x may be used as the second electrode pad 17.

Here, the solder-resist layer 18 will be described in more detail. In this embodiment, the color of the solder-resist layer 18 is set at a transparent or semitransparent light yellow color. The solder-resist layer 18 of the transparent or semitransparent light yellow color can be realized in such a way that a predetermined light yellow type pigment, for example, is contained in an insulating resin whose main ingredient is, for example, an epoxy type resin, or an epoxy type resin and an acryl type resin. As an example of the predetermined light yellow type pigment, there can be mentioned monoazo yellow: C. I. Pigment Yellow 1, 4, 5, 9, 65, 74, benzimidazole yellow: Pigment Yellow 120, 151, 175, 180, 181, 194, flavanthrone yellow: Pigment Yellow 24, azomethyl yellow: Pigment Yellow 117, 129, anthraquinone yellow: Pigment Yellow 123, 147, isoindoline yellow: Pigment Yellow 139, 185, or disazo yellow: Pigment Yellow 155. However, in a case where the transparent or semitransparent light yellow color can be realized by the external color tone of the insulating resin itself, the light yellow type pigment need not always be contained.

The solder-resist layer 18 may contain a filler of silica ($SiO_2$), barium sulfate ($BaSO_4$), calcium carbonate ($CaCO_3$), talc ($Mg_3Si_4O_{10}(OH)_2$), or the like.

The thickness of the solder-resist layer 18 should preferably be 5-50 µm or so. The reason therefor is that, when the thickness of the solder-resist layer 18 exceeds 50 µm, the formation of the opening 18x by a photolithographic process becomes difficult. However, in a case where the opening 18x is formed by a laser machining process or a blast process, the thickness of the solder-resist layer 18 can be set at 5-100 µm or so. When the solder-resist layer 18 has a thickness less than 5 µm, it fails to satisfactorily fulfill the function of covering the wiring pattern.

In the solder-resist layer 18, the "light yellow color" shall be defined as stated below. A glass substrate having a thickness of 1-5 mm is coated with the material of the solder-resist layer 18 to a thickness of 20-50 µm, and the material is hardened by heating at 150° C. for 60 minutes, whereby the solder-resist layer 18 is formed on the glass substrate. A color is stipulated to be the light yellow color in a case where a pantone value at the time when the glass substrate formed with the solder-resist layer 18 is placed on a pure-white sheet of paper and then the external color tone thereof is observed, corresponds to any of values 1-15 in Table 1. The pantone values in Table 1 are numerical values which are stipulated by "Process Chips Process Color Specifier" in "THE PANTONE Process Color System®".

TABLE 1

|    | PANTONE VALUE      |
|----|--------------------|
| 1  | DS1-4C-1-9C        |
| 2  | DS2-5C-2-9C        |
| 3  | DS3-6C-3-8C        |
| 4  | DS5-6C-5-9C        |
| 5  | DS6-6C-6-9C        |
| 6  | DS7-6C-7-8C        |
| 7  | DS9-5C-9-8C        |
| 8  | DS294-6C-294-9C    |
| 9  | DS295-6C-295-9C    |
| 10 | DS298-6C-298-9C    |
| 11 | DS299-6C-299-9C    |
| 12 | DS302-7C-302-9C    |
| 13 | DS303-7C-303-9C    |
| 14 | DS309-6C-309-9C    |
| 15 | DS310-6C-310-9C    |

In the solder-resist layer 18, "being transparent or semitransparent" shall be defined as stated below. A glass substrate having a thickness of 1-5 mm is coated with the material of the solder-resist layer 18 to a thickness of 20-50 µm, and the material is hardened by heating at 150° C. for 60 minutes, whereby the solder-resist layer 18 is formed on the glass substrate. The transmission factor of the glass substrate formed with the solder-resist layer 18 is measured by employing "Spectrum Meter U2000" fabricated by Hitachi, Ltd. as is a UV/visible spectrum measurement apparatus. If the transmission factor for light of predetermined wavelength lies within a range indicated in Table 2, the glass substrate is stipulated to be transparent or semitransparent.

TABLE 2

| WAVELENGTH (nm) | TRANSMISSION FACTOR (%) |
|---|---|
| 360 | 0-20 |
| 460 | 10-40 |
| 560 | 30-60 |
| 660 | 45-70 |
| 760 | 50-75 |
| 860 | 60-80 |

As indicated in Table 2, in the solder-resist layer 18, the transmission factor on a longer wavelength side is higher than on a shorter wavelength side, and hence, the color (having a wavelength of 600-800 nm or so) of copper (Cu) or the like which is the material of the fourth wiring layer 17 placed below the solder-resist layer 18 can be effectively transmitted. As a result, the copper (Cu) or the like being the material of the fourth wiring layer 17 can be visually recognized from the solder-resist layer 18.

There will be described the reason why, in this embodiment, the color of the solder-resist layer 18 is set at the transparent or semitransparent light yellow color. As stated before, even when the color of the first insulating layer 12 itself is, for example, the light yellow color, the gold (Au) film constituting the first wiring layer 11 is exposed from the first insulating layer 12, and copper (Cu) or the like which is the material of the second wiring layer 13 may be seen through the first insulating layer 12, so that the external color tone of the whole side of the first principal surface becomes a light brown color to a brown color.

On the other hand, in the stacked body in which the first wiring layer 11, the first insulating 12, the second wiring layer 13, the second insulating layer 14, the third wiring layer 15, the third insulating layer 16 and the fourth wiring layer 17 are successively stacked, the external color tone of the side of the fourth wiring layer 17 becomes a light brown color to a brown color due to the color tone of copper (Cu) or the like which is the material of the third wiring layer 15 seen through the third insulating layer 16, and the color tone of copper (Cu) or the like which is the material of the fourth wiring layer 17. Accordingly, when the color of the solder-resist layer 18 which is formed so as to cover the fourth wiring layer 17 of the stacked body is set at the transparent or semitransparent light yellow color, the solder-resist layer 18 transmits the external color tone of the side of the fourth wiring layer 17 of the stacked body, so that the external color tone of the second principal surface side becomes a light brown color to a brown color similar to the external color tone of the first principal surface side.

When the first principal surface side and the second principal surface side become the similar external color tone (the light brown color to the brown color) in this manner, a common image recognition apparatus can be employed for the inspections of the first principal surface side and the second principal surface side in case of conducting the external appearance inspections or the likes of the wiring board 10, and the settings of the apparatus can be made substantially identical. As a result, the decrease of equipment investment expenses and the simplification of a manufacturing process are permitted, and the lowering of the price of the wiring board 10 can be realized.

[Method of Manufacturing Wiring Board According to First Embodiment]

Next, there will be described a method of manufacturing a wiring board according to the first embodiment. FIGS. 2-10 are views exemplifying the manufacturing steps of the wiring board according to the first embodiment.

Figure 2:
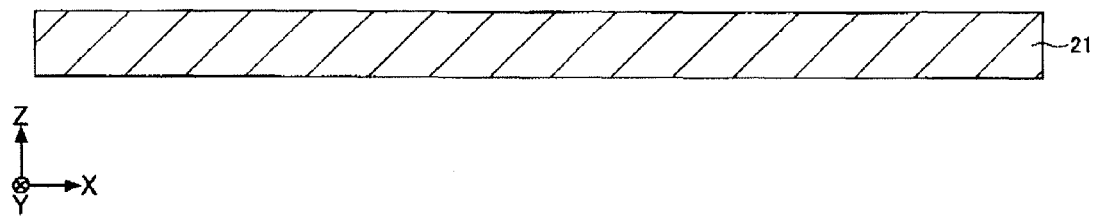
FIGS. 2-10 are views exemplifying manufacturing steps of the wiring board according to the first embodiment.

First, a support 21 is prepared at the step shown in FIG. 2. A silicon plate, a glass plate, a metal foil, a metal plate, or the like can be used as the support 21, and a copper foil is used as the support 21 in this embodiment. The reason therefor is that the copper foil can be utilized as a power feed layer in the case of performing electrolytic plating at the step shown in FIG. 4 to be stated later, etc., and that it is easily removable by etching, after the step shown in FIG. 10 to be stated later. The thickness of the support 21 can be set at, for example, 35-100 μM or so.

Figure 3:
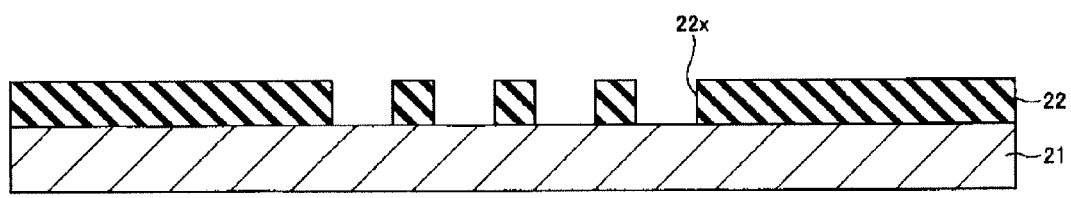

Subsequently, at the step shown in FIG. 3, a resist layer 22 which has openings 22x corresponding to the first wiring layers 11 is formed on one surface of the support 21. Concretely, one surface of the support 21 is coated with a liquid or pasty resist which is made of a photosensitive resin composite containing, for example, an epoxy type resin or an acryl type resin. Alternatively, a filmy resist (for example, a dry film resist) is laminated on one surface of the support 21. The filmy resist is made of, for example, a photosensitive resin composite containing an epoxy type resin or an acryl type resin. Then, the openings 22x are formed in such a way that the resist applied by the coating or the lamination is exposed to light or developed. Thus, the resist layer 22 having the openings 22x is formed. A filmy resist having the openings 22x formed beforehand may is laminated on one surface of the support 21.

The openings 22x are formed at positions corresponding to the first wiring layers 11 which are formed at the step shown in FIG. 4 to be stated later, and the disposition pitch thereof can be set at, for example, 100-200 μm or so. The plan shape of each opening 22x is, for example, a circle, the diameter of which can be set at, for example, 40-120 μm or so.

Subsequently, at the step shown in FIG. 4, the first wiring layers 11 each of which includes the first layer 11a and the second layer 11b are formed inside the openings 22x in one surface of the support 21, by an electrolytic plating process or the like which utilizes the support 21 as a plating power-feed layer.

The first layer 11a has a structure in which a gold (Au) film, a palladium (Pd) film and a nickel (Ni) film, for example, are successively stacked in the order mentioned. In forming the first wiring layer 11, therefore, the first layer 11a may be initially formed in such a way that the gold (Au) film, the palladium (Pd) film and the nickel (Ni) film are successively plated by the electrolytic plating process or the like which utilizes the support 21 as the plating power-feed layer, and the second layer 11b made of copper (Cu) or the like may be subsequently formed on the first layer 11a by the electrolytic plating process or the like which utilizes the support 21 as the plating power-feed layer. The first layer 11a may have a structure in which a gold (Au) film and a nickel (Ni) film are successively stacked in this order.

Figure 4:
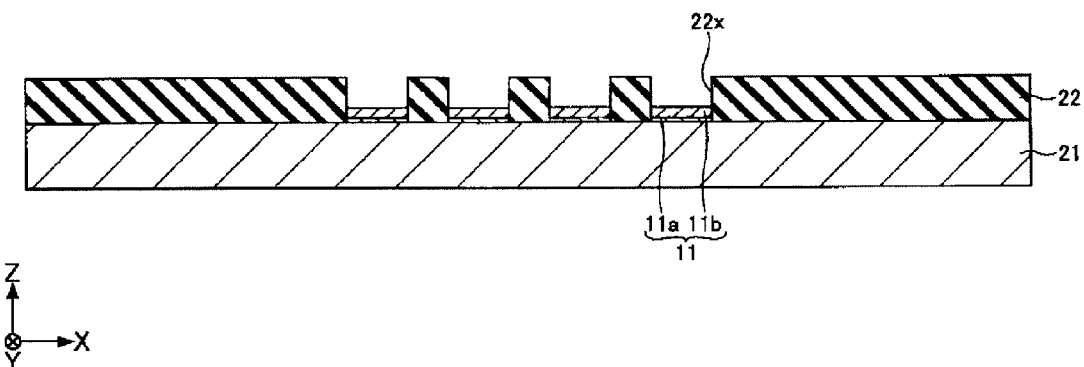
Figure 5:
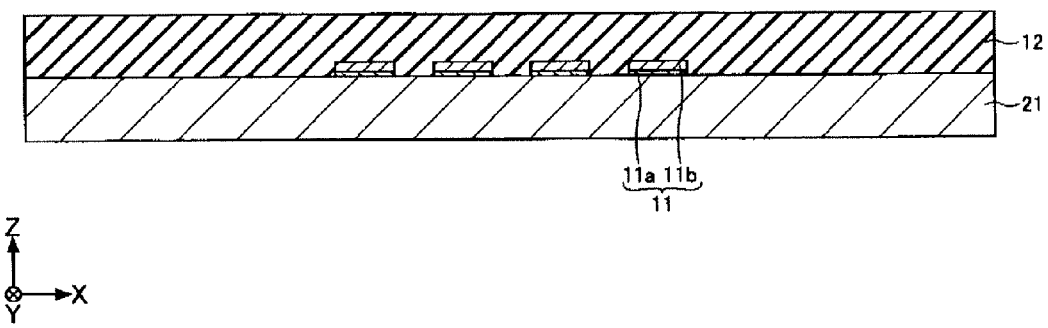

Subsequently, at the step shown in FIG. 5, the resist layer 22 shown in FIG. 4 is removed, and the first insulating layer 12 is thereafter formed on one surface of the support 21 so as to cover the first wiring layers 11. As the material of the first insulating layer 12, there can be used, for example, an insulating resin whose main ingredient is an epoxy type resin. The thickness of the first insulating layer 12 can be set at, for example, 15-35 μm or so. The first insulating layer 12 may contain a filler of silica ($SiO_2$) or the like. The color of the first insulating layer 12 can be set at, for example, a light yellow color.

In a case where an insulating resin whose main ingredient is a thermosetting filmy epoxy type resin, for example, is used as the material of the first insulating layer 12, the filmy first insulating layer 12 is laminated on one surface of the support 21 so as to cover the first wiring layers 11. Then, while the laminated first insulating layer 12 is being pressed, it is heated above its hardening temperature, thereby to be hardened. The lamination with the first insulating layer 12 is conducted in a vacuum atmosphere, whereby voids can be prevented from being involved.

In a case where an insulating resin whose main ingredient is a thermosetting liquid or pasty epoxy type resin, for example, is used as the material of the first insulating layer 12, one surface of the support 21 is coated with the liquid or pasty first insulating layer 12 by, for example, a spin coating process so as to cover the first wiring layers 11. Then, the coating first insulating layer 12 is heated above its hardening temperature, thereby to be hardened.

Figure 6:
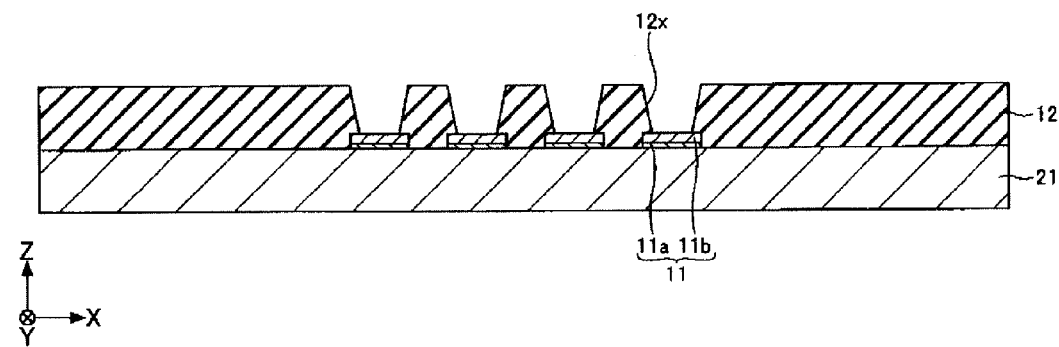

Subsequently, at the step shown in FIG. 6, the first insulating layer 12 is formed with the first via holes 12x which penetrate through the first insulating layer 12, and which expose the upper surfaces of the first wiring layers 11. The first via holes 12x can be formed by a laser machining process which employs, for example, a $CO_2$ laser. Each of the first via holes 12x formed by the laser machining process becomes a circular truncated cone-shaped recess which is open to the side where the second insulating layer 14 is formed, whose bottom surface is formed by the upper surface of the first wiring layer 11. The area of the open part of the first via holes 12x is larger than that of the bottom surface. The other via holes also become a similar shape when formed by the laser machining process. In the case where the first via holes 12x are formed by the laser machining process, a desmearing treatment should preferably be performed, thereby to remove those resin residues of the first insulating layer 12 which adhere on the upper surfaces of the first wiring layers 11 exposed to the bottom parts of the first via holes 12x.

Figure 7:
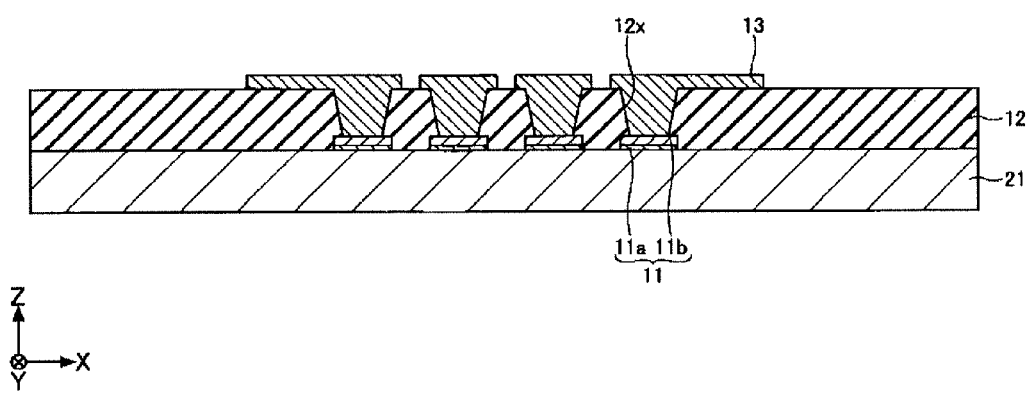

Subsequently, at the step shown in FIG. 7, the second wiring layers 13 are formed on the first insulating layer 12. Each of the second wiring layers 13 includes the via which is filled in the first via hole 12x, and the wiring pattern which is formed on the first insulating layer 12. The second wiring layer 13 is electrically connected with the first wiring layer 11 which is exposed to the bottom part of the first via hole 12x. Copper (Cu), for example, can be used as the material of the second wiring layers 13.

The second wiring layers 13 can be formed by employing any of various wiring formation methods such as a semi-additive process and a subtractive process. The method in which the second wiring layers 13 are formed by employing the semi-additive process will be explained below.

First of all, a seed layer (not shown) made of copper (Cu) or the like is formed on the first insulating layer 12 which includes the upper surface of each first wiring layer 11 exposed to the bottom part of the corresponding first via hole 12x, and the side wall of the first via hole 12x, by an electroless plating process or a sputtering process. Further, a resist layer (not shown) which has an opening corresponding to the second wiring layer 13 is formed on the seed layer. Then, a wiring layer (not shown) made of copper (Cu) or the like is formed in the opening of the resist layer, by an electrolytic plating process which utilizes the seed layer as a power feed layer. Subsequently, the resist layer is removed, and that part of the seed layer which is not covered with the wiring layer is thereafter etched and removed with the wiring layer used as a mask. Thus, the second wiring layer 13 which includes the via filled in the first via hole 12x, and the wiring pattern formed on the first insulating layer 12, is formed on the first insulating layer 12.

Figure 8:
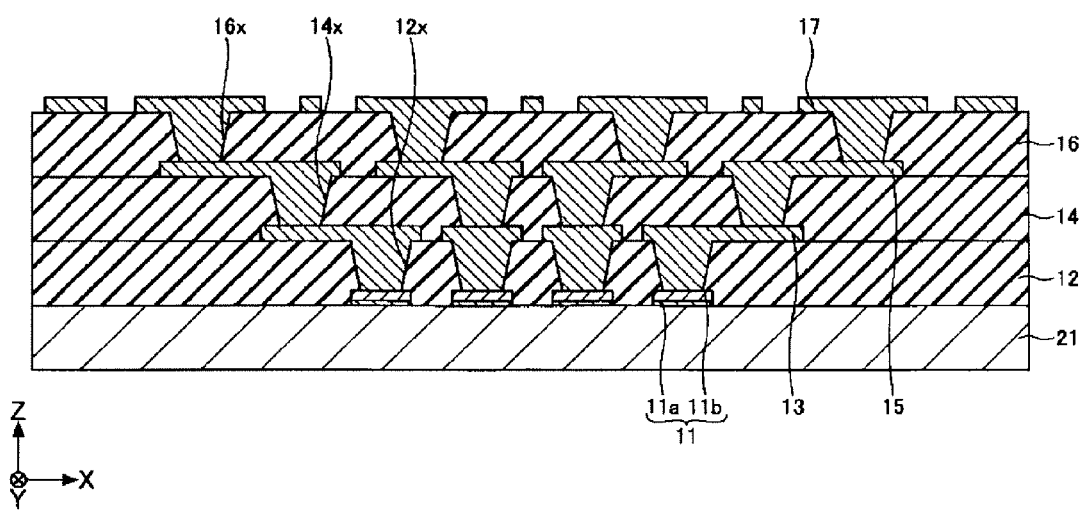

Subsequently, at the step shown in FIG. 8, the second insulating layer 14, the third wiring layers 15, the third insulating layer 16 and the fourth wiring layers 17 are stacked on the first insulating layer 12 by repeating processes similar to the above. More specifically, the second insulating layer 14 covering the second wiring layers 13 is formed on the first insulating layer 12, the second via holes 14x penetrating through the second insulating layer 14 and exposing the upper surfaces of the second wiring layers 13 are thereafter formed. As the material of the second insulating layer 14, there can be used an insulating resin similar to that of the first insulating layer 12. The thickness of the second insulating layer 14 can be set at, for example, 15-35 μm or so. The second insulating layer 14 may contain a filler of silica ($SiO_2$) or the like. The color of the second insulating layer 14 can be set at, for example, a light yellow color.

Further, the third wiring layers 15 which are connected to the second wiring layers 13 through the second via holes 14x are formed on the second insulating layer 14. Each of the third wiring layers 15 includes the via filled in the second via hole 14x, and the wiring pattern formed on the second insulating layer 14. The third wiring layer 15 is electrically connected with the second wiring layer 13 which is exposed to the bottom part of the second via hole 14x. As the material of the third wiring layers 15, there can be used, for example, copper (Cu). The third wiring layers 15 can be formed by, for example, a semi-additive process. The thickness of the wiring pattern constituting the third wiring layer 15 can be set at, for example, 10-20 μm or so.

Further, the third insulating layer 16 covering the third wiring layers 15 is formed on the second insulating layer 14, the third via holes 16x penetrating through the third insulating layer 16 and exposing the upper surfaces of the third wiring layers 15 are thereafter formed. As the material of the third insulating layer 16, there can be used an insulating resin which is similar to that of the first insulating layer 12 and the second insulating layer 14. The thickness of the third insulating layer 16 can be set at, for example, 15-35 μm or so. The third insulating layer 16 may contain a filler of silica ($SiO_2$) or the like. The color of the third insulating layer 16 can be set at, for example, a light yellow color.

Further, the fourth wiring layers 17 which are connected to the third wiring layers 15 through the third via holes 16x are formed on the third insulating layer 16. Each of the fourth wiring layers 17 includes the via which is filled in the third via hole 16x, and the wiring pattern which is formed on the third insulating layer 16. The fourth wiring layer 17 is electrically connected with the third wiring layer 15 which is exposed to the bottom part of the third via hole 16x. As the material of the fourth wiring layers 17, there can be used, for example, copper (Cu). The fourth wiring layers 17 are formed by, for example, a semi-additive process. The thickness of the wiring pattern constituting the fourth wiring layer 17 can be set at, for example, 10-20 μm or so.

In this way, the predetermined build-up wiring layers are formed on one surface of the support 21. Although the three build-up wiring layers (the second wiring layers 13, the third wiring layers 15 and the fourth wiring layers 17) have been formed in this embodiment, n (any integer of at least one) build-up wiring layers may be formed.

Subsequently, at the step shown in FIG. 9, the solder-resist layer 18 covering the fourth wiring layers 17 is formed on the third insulating layer 16. The solder-resist layer 18 can be formed in such a way that the surface of the third insulating layer 16 is coated with, for example, the liquid or pasty photosensitive epoxy-type insulating resin which contains the aforementioned light yellow type pigment, so as to cover the fourth wiring layers 17, by a screen printing process, a roll coating process, a spin coating process or the like. Alternatively, the solder-resist layer 18 may be formed in such a way that for example, the filmy photosensitive epoxy-type insulating resin which contains the aforementioned light yellow type pigment is laminated on the surface of the third insulating layer 16, so as to cover the fourth wiring layers 17. However, in a case where a transparent or semitransparent light yellow color can be realized by the external color tone of the epoxy type insulating resin or the like insulating resin itself, the light yellow type pigment need not always be contained.

Figure 9:
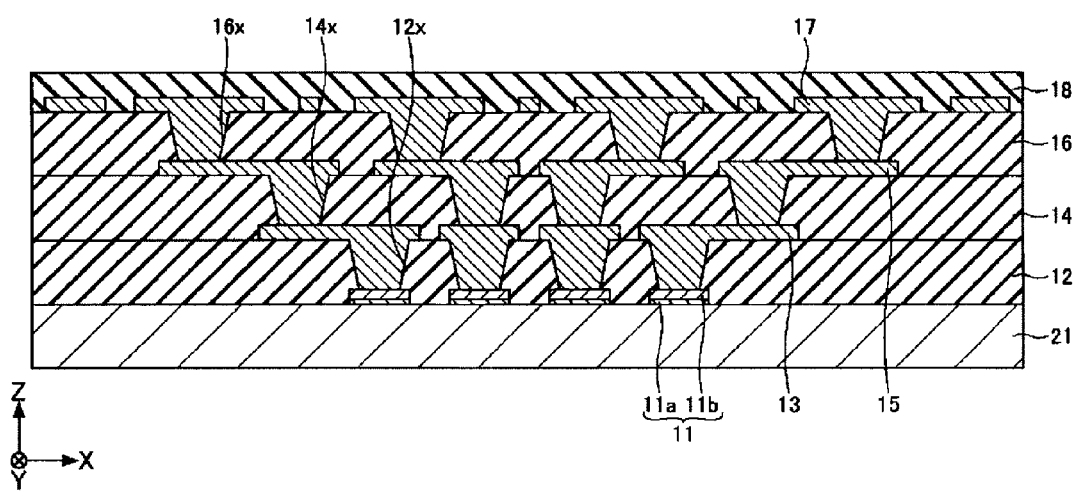

Subsequently, at the step shown in FIG. 10, the insulating resin applied by the coating or the lamination at the step shown in FIG. 9 is exposed to light or developed, thereby to form the openings 18$x$ (a photolithographic process). Thus, the solder-resist layer 18 having the openings 18$x$ is formed. A filmy insulating resin having the openings 18$x$ formed beforehand may be laminated on the surface of the third insulating layer 16, so as to cover the fourth wiring layers 17. A non-photosensitive insulating resin may be used as the material of the solder-resist layer 18. In this case, after the solder-resist layer 18 is formed on the third insulating layer 16 and is hardened, the openings 18$x$ can be formed by a laser machining process employing, for example, a $CO_2$ laser, or a blast process employing a polishing agent, for example, alumina grains.

In the case where the photosensitive insulating resin is used as the solder-resist layer 18 and where the openings 18$x$ are formed by the photolithographic process, the thickness of the solder-resist layer 18 should preferably be 5-50 μm or so. In a case where the thickness of the solder-resist layer 18 is 50-100 μm or so, it is difficult to form the openings 18$x$ by the photolithographic process. Therefore, irrespective of whether the material of the solder-resist layer 18 is photosensitive or non-photosensitive, the openings 18$x$ should preferably be formed by the laser machining process or the blast process.

Figure 10:
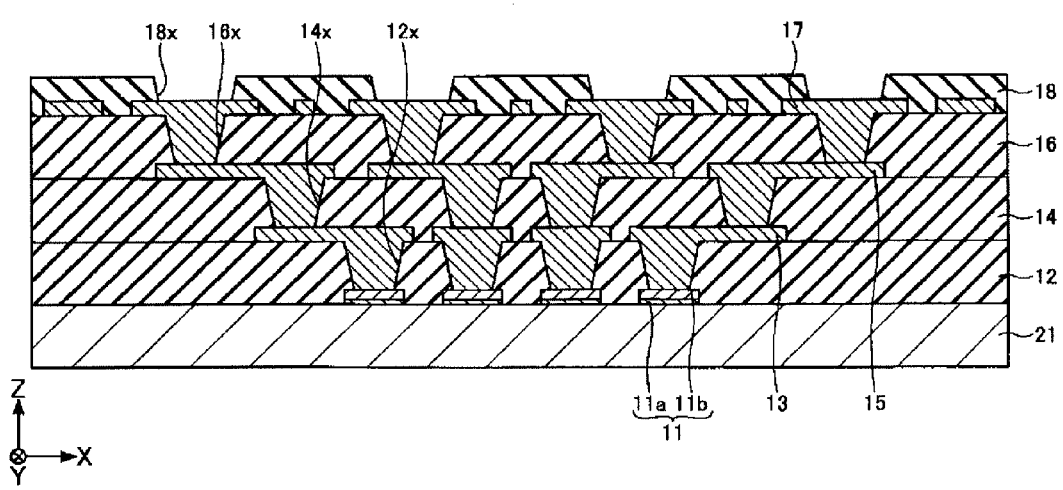

The solder-resist layer 18 having the openings 18$x$ is formed by the step shown in FIG. 10, and part of each fourth wiring layer 17 is exposed to the interior of the corresponding opening 18$x$. The fourth wiring layer 17 (second electrode pad 17) exposed to the interior of the opening 18$x$ functions as an electrode pad for electrical connection with a pad which is disposed in a mother board or the like mounting board (not shown).

If necessary, the fourth wiring layer 17 exposed to the bottom part of the opening 18$x$ may be overlaid with a metal layer by, for example, an electroless plating process. As an example of the metal layer, there can be mentioned an Au layer, an Ni/Au layer (a metal layer in which an Ni layer and an Au layer are stacked in this order), an Ni/Pd/Au layer (a metal layer in which an Ni layer, a Pd layer and an Au layer are stacked in this order), or the like.

Subsequently, after the step shown in FIG. 10, the support 21 shown in FIG. 10 is removed, whereby the wiring board 10 shown in FIG. 1 is finished up. The support 21 configured of the copper foil can be removed by wet etching which uses, for example, an aqueous solution of ferric chloride, an aqueous solution of cupric chloride or an aqueous solution of ammonium persulfate. On this occasion, the outermost layer of the first wiring layer 11 exposed from the first insulating layer 12 is a gold (Au) film or the like, so that only the support 21 configured of the copper foil can be selectively etched. However, in a case where the fourth wiring layer 17 is configured of copper (Cu), the part of the fourth wiring layer 17 exposed to the bottom part of the opening 18$x$ needs to be masked in order that the exposed part may be prevented from being etched together with the support 21.

After the support 21 has been removed, an external connection terminal such as a solder ball or a lead pin may be formed on the fourth wiring layer 17 exposed to the bottom part of the opening 18$x$ (or on a metal layer in a case where the metal layer is formed on the fourth wiring layer 17 exposed to the bottom part of the opening 18$x$). The external connection terminal serves as a terminal for electrical connection with the mother board or the like mounting board (not shown). However, the fourth wiring layer 17 exposed to the bottom part of the opening 18$x$ (or the metal layer in the case where the metal layer is formed on the fourth wiring layer 17), itself may be used as the external connection terminal. The external connection terminal such as the solder ball or the lead pin may be formed before the support 21 is removed.

The example in which one wiring board 10 is fabricated on the support 21 has been illustrated in FIGS. 2-10, but it is also allowed to perform a process in which a member to become a plurality of wiring boards 10 is fabricated on the support 21, and it is individualized after the removal of the support 21, thereby to obtain the plurality of wiring boards 10.

[Confirmation of Resolution of Exposure to Light]

At the step shown in FIG. 10, the openings 18$x$ have been formed by subjecting the solder-resist layer 18 to the exposure to light and the development (the photolithographic process). A green material has heretofore been used for a solder-resist layer in the related art, but the transparent or semitransparent material of light yellow color has been used for the solder-resist layer 18 in this embodiment. Therefore, whether or not the resolution of the exposure to light in the case of the formation of the openings by the photolithographic process is problematic has been confirmed.

Figure 11:
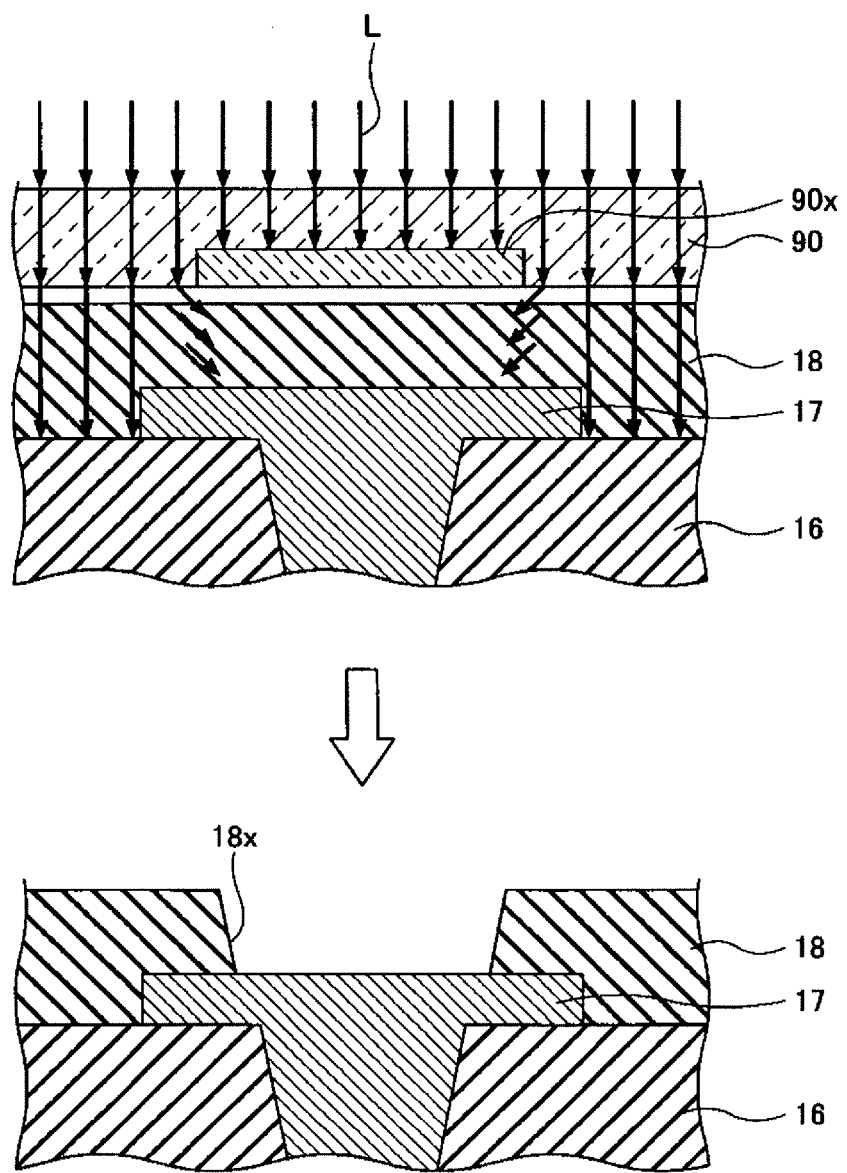
FIG. 11 is a model view exemplifying a situation where openings are formed in a solder-resist layer according to the first embodiment.
Figure 12A:
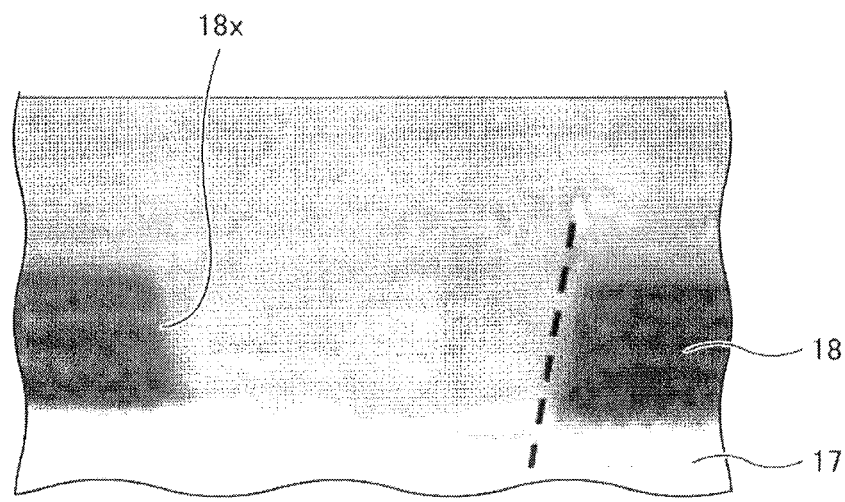
FIGS. 12A and 12B are SEM images each showing an example in which the openings are formed in the solder-resist layer according to the first embodiment.
Figure 12B:
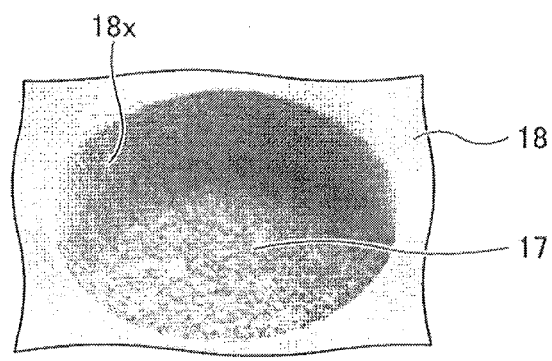

FIG. 11 is a model view exemplifying a situation where openings are formed in a solder-resist layer according to a first embodiment. FIGS. 12A and 12B are SEM images each showing an example in which the openings are formed in the solder-resist layer according to the first embodiment. FIG. 12A shows a section corresponding to FIG. 11, while FIG. 12B shows a state where FIG. 12A is seen in an obliquely upper direction.

As shown in FIG. 11, when exposure light L being ultraviolet radiation is projected onto the solder-resist layer 18 through a mask 90 which is made of glass or the like, it is scattered at the end part of the shield portion 90$x$ of the mask 90 and is turned in the centripetal direction of the shield portion 90$x$. As shown in FIG. 11 and FIGS. 12A and 12B, therefore, when a part exposed to the light is developed, the sectional shape of the side wall of the opening 18$x$ does not become perpendicular to the upper surface of the fourth wiring layer 17. The opening 18$x$ becomes a circular truncated cone-shaped recess whose bottom surface is formed by the upper surface of the fourth wiring layer 17, and in which the area of an open part is larger than that of the bottom surface. The solder-resist layer 18 becomes a favorable state where a residue hardly exists on the fourth wiring layer 17 exposed to the bottom part of the opening 18$x$.

According to the inventors' study, it has been confirmed that the inclinations of the side walls of the openings 18$x$ and the residues on the fourth wiring layers 17 exposed to the bottom parts of the openings 18$x$ are substantially equal between in the case of using the transparent or semitransparent light-yellow material for the solder-resist layer 18 and in the case of using the green material for the solder-resist layer 18 as in the related art. That is, even when the color of the solder-resist layer 18 is changed from the green color to the transparent or semitransparent light-yellow color, the resolution of the exposure to the light remains equal.

Meanwhile, in this embodiment, the color of copper (Cu) or the like being the material of the fourth wiring layer 17 is seen through the solder-resist layer 18, whereby the external color tone of the second principal surface side may become a light brown color to a brown color which is similar to the external color tone of the first principal surface side. It is accordingly also considered to set the solder-resist layer at a color which is nearly colorless transparent. Therefore, the inventors studied also the resolution of the light exposure of a solder-resist layer 180 whose color is set to be nearly colorless transparent. The result will be indicated as Comparative Example 1.

Figure 13:
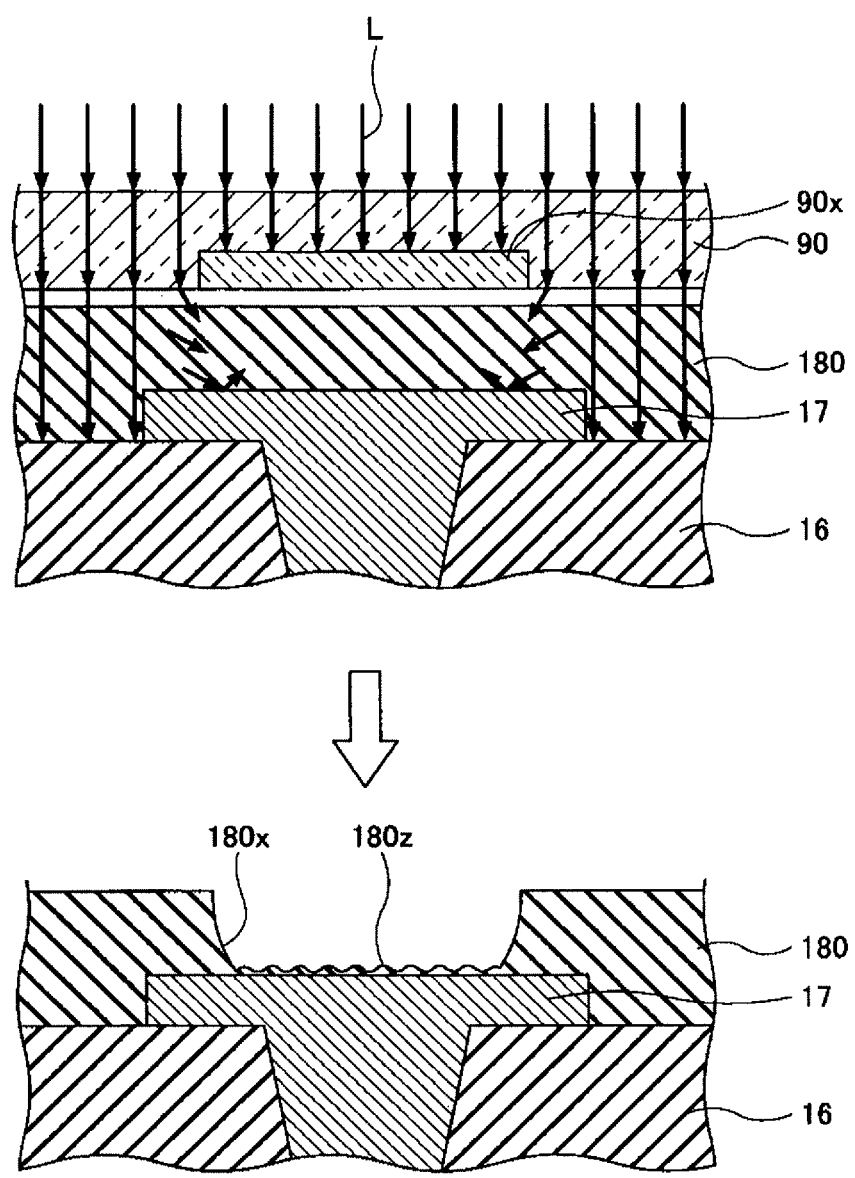
FIG. 13 is a model view exemplifying a situation where openings are formed in the solder-resist layer according to Comparative Example 1.
Figure 14A:
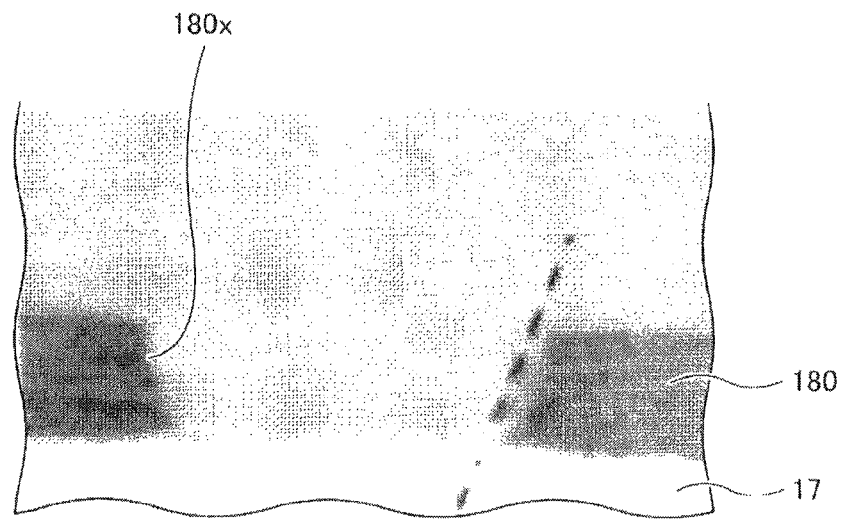
FIGS. 14A and 14B are SEM images each showing an example in which the openings are formed in the solder-resist layer according to Comparative Example 1.
Figure 14B:
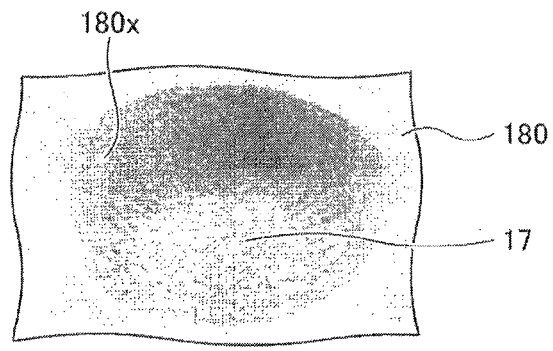

FIG. 13 is a model view exemplifying a situation where openings are formed in the solder-resist layer according to Comparative Example 1. FIGS. 14A and 14B are SEM images each showing an example in which the openings are formed in the solder-resist layer according to Comparative Example 1. FIG. 14A shows a section corresponding to FIG. 13, while FIG. 14B shows a state where FIG. 14A is seen in an obliquely upper direction.

As shown in FIG. 13, when exposure light L being ultraviolet radiation is projected onto the solder-resist layer 180 according to Comparative Example 1 (the solder-resist layer of the color being nearly colorless transparent), through a mask 90 which is made of glass or the like, it is scattered at the end part of the shield portion 90x of the mask 90 and is turned in the centripetal direction of the shield portion 90x, as in FIG. 11. However, the degree to which the exposure light L is scattered at the end part of the shield portion 90x of the mask 90 is larger than in the case of FIG. 11. As shown in FIG. 13 and FIGS. 14A and 14B, therefore, the inclination of the side wall of the opening 180x become gentler than in the opening 18x shown in FIG. 11 (become nearer to an R-shape), and a residue 180z appears on the fourth wiring layer 17 exposed to the bottom part of the opening 180x.

In this manner, when the solder-resist layer 180 whose color is nearly colorless transparent is used, the external color tone of the second principal surface side becomes the light brown color to the brown color similar to the external color tone of the first principal surface side, but the resolution of the light exposure becomes lower than in the case where the solder-resist layer is in the green color or the transparent or semitransparent light-yellow color. It is therefore difficult to apply the solder-resist layer 180 to the actual product (wiring board). It is accordingly preferable to use the transparent or semitransparent light-yellow solder-resist layer which is equal to the green solder-resist layer in the resolution of the light exposure.

After all, according to the first embodiment, the solder-resist layer 18 is set at the transparent or semitransparent light-yellow color, whereby the solder-resist layer 18 transmits the external color tone (the light brown color to the brown color) of the side of the fourth wiring layer 17 in the stacked body in which the first wiring layer 11, the first insulating layer 12, the second wiring layer 13, the second insulating layer 14, the third wiring layer 15, the third insulating layer 16 and the fourth wiring layer 17 are successively stacked, and hence, the external color tone of the second principal surface side becomes the light brown color to the brown color similar to the external color tone of the first principal surface side. As a result, in conducting the external appearance inspections of the wiring board 10, a common image recognition apparatus can be employed for the inspections of the first principal surface side and the second principal surface side, and the settings thereof can be held substantially identical. Furthermore, the decrease of equipment investment expenses and the simplification of a manufacturing process are permitted, and the lowering of the price of the wiring board 10 can be realized.

<Modification 1 of First Embodiment>

As Modification 1 of the first embodiment, there will be shown an example in which an identification mark is provided at a part of each fourth wiring layer. In the modification 1 of the first embodiment, the same constituent components as in the embodiments already described shall be omitted from description.

Figure 15:
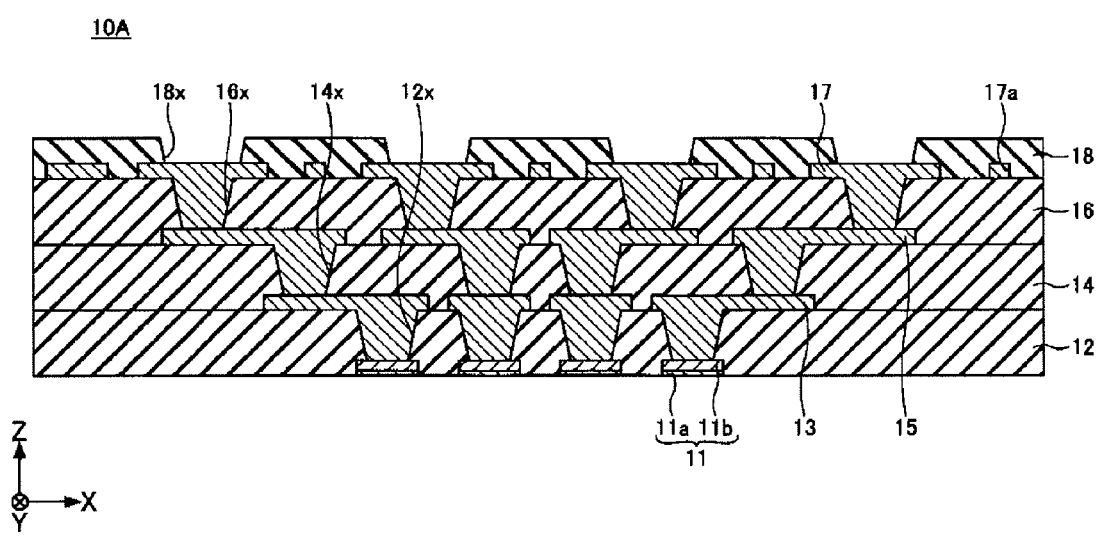
FIG. 15 is a sectional view exemplifying a wiring board according to a modification 1 of the first embodiment.

FIG. 15 is a sectional view exemplifying the wiring board according to the modification 1 of the first embodiment. Referring to FIG. 15, the wiring board 10A according to the modification 1 of the first embodiment differs from the wiring board 10 (refer to FIG. 1) in the point that the identification mark 17a is provided at part of each wiring layer 17. Here, the identification mark 17a is a mark for making the identification or the like of the wiring board 10A being a product, such as a product No. or a recognition mark. For example, the identification mark 17a may be a numeral or alphabetic letter which is formed similarly to the wiring pattern, or it may be a pattern whose plan shape is a circular shape, a cross shape or the like. The identification marks 17a are formed in such a way that, in forming the fourth wiring layers 17, parts of a material (a plating layer) which is to become the fourth wiring layers 17 are patterned similarly to the fourth wiring layers 17.

The identification marks 17a are covered with the solder-resist layer 18. Since, however, the solder-resist layer 18 is in the transparent or semitransparent light-yellow color, the identification marks 17a are visually recognizable through the solder-resist layer 18 without providing any openings in the solder-resist layer 18.

Figure 16A:
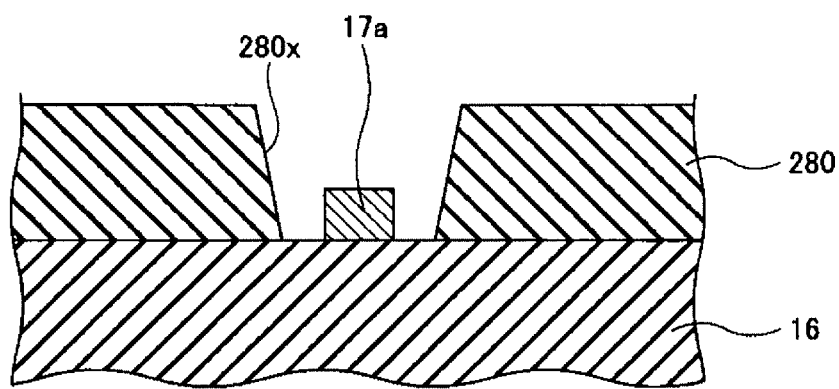
FIGS. 16A and 16B are sectional views for explaining an identification mark according to Comparative Example 2.
Figure 16B:
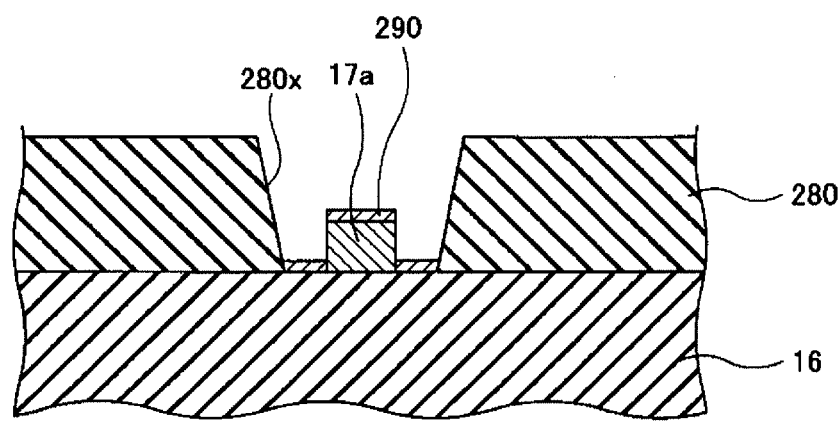

FIGS. 16A and 16B are sectional views for explaining an identification mark according to Comparative Example 2. FIG. 16A shows a case where a metal layer 290 is not formed on the identification mark 17a, while FIG. 16B shows a case where the metal layer 290 is formed on the identification mark 17a and on the third insulating layer 16 exposed to the bottom part of an opening 280x. The metal layer 290 is an Au layer, an Ni/Au layer (a metal layer in which an Ni layer and an Au layer are stacked in this order), or the like.

A green insulating resin is used for the solder-resist layers 280 shown in FIGS. 16A and 16B. The green insulating resin has been used as the solder-resist layer 280 in the related art. Accordingly, when the identification mark 17a has been covered with the solder-resist layer 280, it has not been visually recognizable through the solder-resist layer 280. As shown in FIGS. 16A and 16B, therefore, the openings 280x have been provided around the identification marks 17a.

The metal layer 290 may be formed on the fourth wiring layer 17 by an electroless plating process, for the reasons of enhancing the reliability of connection with a solder, etc. In this case, the metal layer 290 is formed also on the identification mark 17a which is part of the fourth wiring layer 17. In actuality, however, the metal layer 290 may fails to be formed on the identification mark 17a (refer to FIG. 16A), or the metal layer 290 may be formed, not only on the identification mark 17a, but also on that third insulating layer 16 exposed to the bottom part of the opening 280x on which the metal layer 290 ought not to be formed (refer to FIG. 16B). The reason therefor is that the identification mark 17a is small in the volume of a conductor part to-be-plated, so it becomes a low potential and is difficult of plating.

When the wiring board becomes the state as shown in FIG. 16A or 16B, it is judged to have a defective external appearance, and hence, the state is problematic in manufacture. According to the wiring board 10A of the embodiment, the identification mark 17a can be visually recognized without providing any opening, and hence, the identification mark 17a is not to be formed with the metal layer, so that the problem as in FIG. 16A or FIG. 16B does not occur.

In this manner, according to Modification 1 of the first embodiment, advantages similar to those of the first embodiment are achieved, and an advantage to be stated below is further achieved. Since the identification mark 17a can be seen through the solder-resist layer 18, the identification mark 17a need not be exposed from the solder-resist layer 18. As a result, the identification mark 17a is not to be formed with the metal layer. It is accordingly possible to avoid the problems in the external appearance; that the metal layer fails to be formed on the identification mark 17a or that the metal layer is formed on the unnecessary part.

<Modification 2 of First Embodiment>

In the first embodiment, there has been illustrated the example in which the side of the first electrode pads 11 is set as the side for mounting the semiconductor chip, while the side of the second electrode pads 17 is set as the side of the external connection terminals. In the modification 2 of the first embodiment, there will be illustrated an example in which the side of first electrode pads 11 is set as the side of the external connection terminals, while the side of second electrode pads 17 is set as the side for mounting the semiconductor chip. In the modification 2 of the first embodiment, the same constituent components as in the embodiments already described shall be omitted from description.

Figure 17:
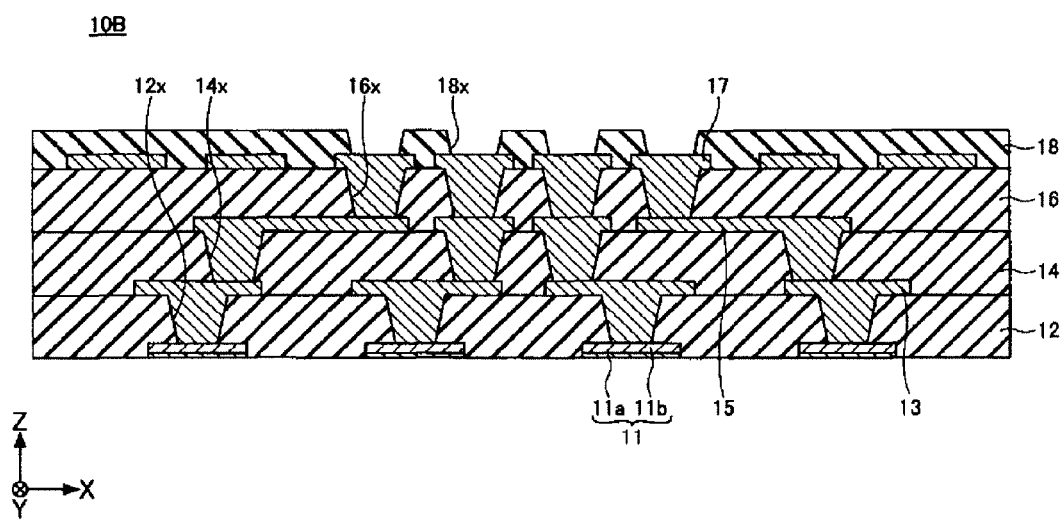
FIG. 17 is a sectional view exemplifying a wiring board according to a modification 2 of the first embodiment.

FIG. 17 is a sectional view exemplifying a wiring board according to the modification 2 of the first embodiment. Referring to FIG. 17, the wiring board 10B according to the first embodiment is a coreless build-up wiring board which, likewise to the wiring board 10 (refer to FIG. 1), includes a stacked body where the first wiring layers 11, a first insulating layer 12, second wiring layers 13, a second insulating layer 14, third wiring layers 15, a third insulating layer 16, and the fourth wiring layers 17 are successively stacked, and a solder-resist layer 18 formed so as to cover the fourth wiring layers 17 exposed to one side of the stacked body.

In the wiring board 10B, however, the side of the first electrode pads 11 is the side of the external connection terminals, and the side of the second electrode pads 17 is the side for mounting the semiconductor chip. The pitch of the first electrode pads 11 can be set at, for example, 500-1200 μm or so, while the pitch of the second electrode pads 17 is narrower than that of the first electrode pads 11 and can be set at, for example, 100-200 μm or so. Further, the diameter of the second electrode pad 17 can be set, for example, 40-120 μm while the diameter of the first electrode pad 11 can be set, for example, 200-1000 μm.

A method of manufacturing the wiring board 10B is similar to the method of manufacturing the wiring board 10, except the points that the pitches of the first electrode pads 11 and the second electrode pads 17, the formation positions of individual via holes, etc. are different.

In this manner, according to the modification 2 of the first embodiment, advantages similar to those of the first embodiment are achieved in spite of the configuration in which the side of the first electrode pads 11 is set as the side of the external connection terminals, while the side of the second electrode pads 17 is set as the side for mounting the semiconductor chip.

Second Embodiment

A second embodiment illustrates an example of a semiconductor package in which a semiconductor chip is mounted on the wiring board 10 (refer to FIG. 1) according to the first embodiment. In the second embodiment, the same constituent components as in the embodiments already described shall be omitted from description.

Figure 18:
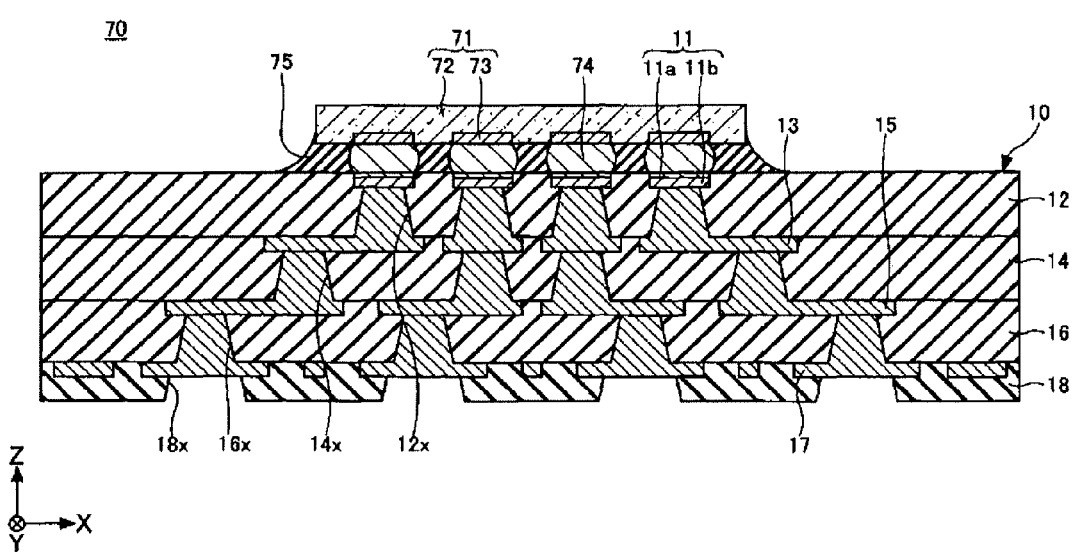
FIG. 18 is a sectional view (#1) exemplifying a semiconductor package according to a second embodiment.

FIG. 18 is a sectional view (#1) exemplifying the semiconductor package according to the second embodiment. Referring to FIG. 18, the semiconductor package 70 includes the wiring board 10 shown in FIG. 1, the semiconductor chip 71, bumps 74, and an underfill resin 75. In FIG. 18, the wiring board 10 is depicted upside down with respect to FIG. 1.

The semiconductor chip 71 includes a body 72, and electrode pads 73. The body 72 is such that a semiconductor integrated circuit (not shown) or the like is formed on a thinned semiconductor board (not shown) made of silicon or the like. The body 72 is formed with the electrode pads 73. The electrode pads 73 are electrically connected with the semiconductor integrated circuit (not shown). Aluminum (Al), for example, can be used as the material of the electrode pads 73.

Each of the bumps 74 electrically connects the electrode pad 73 of the semiconductor chip 71 and the first wiring layer 11 (the first layer 11a) exposed from the first insulating layer 12 of the wiring board 10. The bumps 74 are, for example, solder bumps. As the material of the solder bumps, there can be used, for example, an alloy containing lead (Pb), an alloy of tin (Sn) and copper (Cu), an alloy of tin (Sn) and silver (Ag), or an alloy of tin (Sn), silver (Ag) and copper (Cu). The underfill resin 75 is filled between the semiconductor chip 71 and one surface of the wiring board 10.

Figure 19:
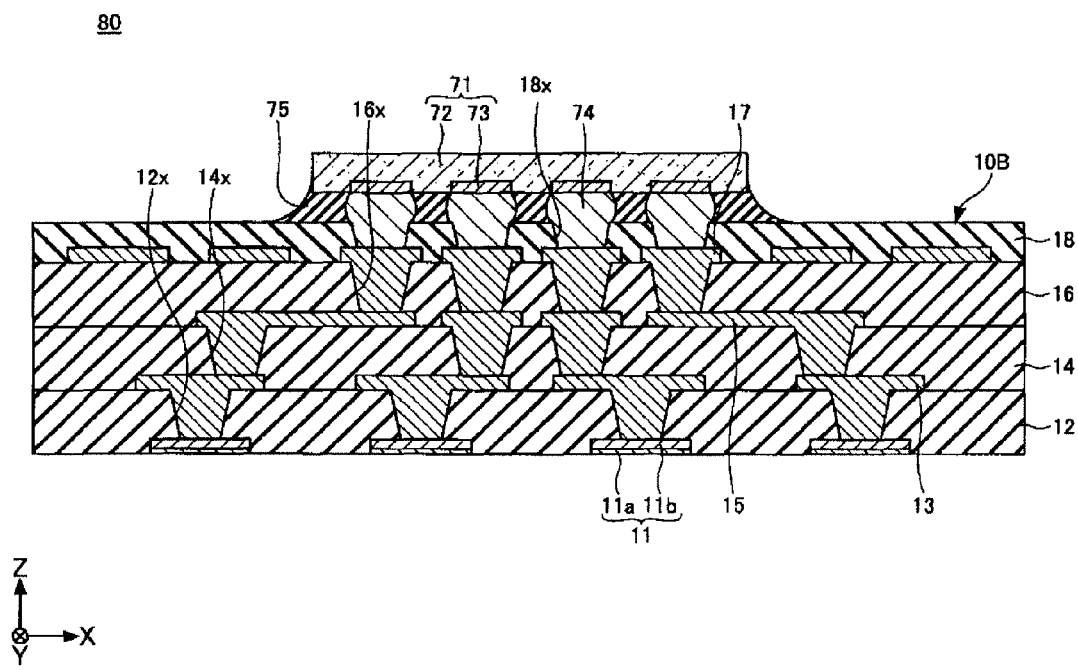
FIG. 19 is a sectional view (#2) exemplifying the semiconductor package according to the second embodiment.

FIG. 19 is a sectional view (#2) exemplifying the semiconductor package according to the second embodiment. As in the semiconductor package 80 shown in FIG. 19, the semiconductor chip 71 may be mounted on the wiring board 10B according to the modification 2 of the first embodiment. Although no illustration is made, it is needless to say that the semiconductor chip 71 may be mounted on a wiring board in which the wiring board 10A according to the modification 1 of the first embodiment or the wiring board 10B according to the modification 2 of the first embodiment is provided with identification marks.

In this manner, according to the second embodiment, there can be realized the semiconductor package in which the semiconductor chip is mounted on the wiring board according to the first embodiment or the modification thereof.

While certain embodiments have been described, these embodiments have been presented by way of example only, and are not intended to limit the scope of the invention. Indeed, the novel device and method described herein may be embodied in a variety of other forms; furthermore, various omissions, substitutions and changes in the form of the device and method, described herein may be made without departing from the spirit of the invention. The accompanying claims and their equivalents are intended to cover such forms or modifications as would fall within the scope and spirit of the invention.

What is claimed is:

1. A wiring board comprising:
  a stacked body having a plurality of insulating layers and a plurality of wiring layers which are alternately stacked; and
  a solder-resist layer being formed on one side of the stacked body and covering the wiring layer exposed to the one side of the stacked body;
  wherein the insulating layer is exposed to the other side of the stacked body, and
  the solder-resist layer is in a transparent or semitransparent light yellow color.

2. The wiring board as defined in claim 1, wherein the wiring layer exposed to one side of the stacked body is visually recognizable through the solder-resist layer.

3. The wiring board as defined in claim 1, wherein a pantone value of the solder-resist layer corresponds to any of DS1-4C-1-9C, DS2-5C-2-9C, DS3-6C-3-8C, DS5-6C-5-9C, DS6-6C-6-9C, DS7-6C-7-8C, DS9-5C-9-8C, DS294-6C-294-9C, DS295-6C-295-9C, DS298-6C-298-9C, DS299-6C-299-9C, DS302-7C-302-9C, DS303-7C-303-9C, DS309-6C-309-9C, and DS310-6C-310-9C.

4. The wiring board as defined in claim 1, wherein a transmission factor of the solder-resist layer for light having a wavelength of 360 nm is 0%-20%, a transmission factor for light having a wavelength of 460 nm is 10%-40%, a transmission factor for light having a wavelength of 560 nm is 30%-60%, a transmission factor for light having a wavelength of 660 nm is 45%-70%, a transmission factor for light having a wavelength of 760 nm is 50%-75%, and a transmission factor for light having a wavelength of 860 nm is 60%-80%.

5. The wiring board as defined in claim 3, wherein a transmission factor of the solder-resist layer for light having a wavelength of 360 nm is 0%-20%, a transmission factor for light having a wavelength of 460 nm is 10%-40%, a transmission factor for light having a wavelength of 560 nm is 30%-60%, a transmission factor for light having a wavelength of 660 nm is 45%-70%, a transmission factor for light having a wavelength of 760 nm is 50%-75%, and a transmission factor for light having a wavelength of 860 nm is 60%-80%.

6. The wiring board as defined in claim 1, wherein a thickness of the solder-resist layer is 5 μm-50 μm.

7. The wiring board as defined in claim 1, wherein the solder-resist layer contains a light yellow type pigment.

8. The wiring board as defined in claim 1, wherein:
the wiring layer exposed to one side of the stacked body includes at least one identification mark, and
the identification mark is visually recognizable through the solder-resist layer.

9. The wiring board as defined in claim 1, wherein:
another wiring layer is exposed from the insulating layer exposed to the other side of the stacked body, and the other wiring layer functions as a first electrode pad; and
the solder resist layer includes an opening which exposes part of the wiring layer exposed to one side of the stacked body, and the wiring layer exposed into the opening functions as a second electrode pad.

10. The wiring board as defined in claim 9, wherein:
either of the first and second electrode pads is an electrode pad for electrical connection with a semiconductor chip; and
the other of them is an electrode pad for electrical connection with another board.

11. The wiring board as defined in claim 1, wherein:
the stacked body does not include any member serving as a core;
the individual wiring layers are connected to one another by wiring lines penetrating through the insulating layers; and
a diameter of each of the wiring lines on one side of the stacked body is larger than a diameter on the other side of the stacked body.

12. The wiring board as defined in claim 3, wherein:
the stacked body does not include any member serving as a core;
the individual wiring layers are connected to one another by wiring lines penetrating through the insulating layers; and
a diameter of each of the wiring lines on one side of the stacked body is larger than a diameter on the other side of the stacked body.

13. The wiring board as defined in claim 4, wherein:
the stacked body does not include any member serving as a core;
the individual wiring layers are connected to one another by wiring lines penetrating through the insulating layers; and
a diameter of each of the wiring lines on one side of the stacked body is larger than a diameter on the other side of the stacked body.

14. The wiring board as defined in claim 5, wherein:
the stacked body does not include any member serving as a core;
the individual wiring layers are connected to one another by wiring lines penetrating through the insulating layers; and
a diameter of each of the wiring lines on one side of the stacked body is larger than a diameter on the other side of the stacked body.

15. A semiconductor package in which a semiconductor chip is mounted on a wiring board as defined in claim 1.

* * * * *